United States Patent
Liu et al.

(10) Patent No.: US 11,896,955 B2
(45) Date of Patent: Feb. 13, 2024

(54) METHOD FOR PREPARING CHLORINE ADSORPTION MATERIAL FOR USE IN WASTE INCINERATION AND APPLICATION OF CHLORINE ADSORPTION MATERIAL

(71) Applicants: FUZHOU UNIVERSITY, Fujian (CN); FUJIAN BOYI ENVIRONMENTAL PROTECTION TECHNOLOGY CO. LTD., Fujian (CN)

(72) Inventors: Minghua Liu, Fujian (CN); Lingmin Zhang, Fujian (CN); Chunxiang Lin, Fujian (CN); Yifan Liu, Fujian (CN); Yuancai Lv, Fujian (CN); Dengzhou Liu, Fujian (CN)

(73) Assignees: FUZHOU UNIVERSITY, Fujian (CN); FUJIAN BOYI ENVIRONMENTAL PROTECTION TECHNOLOGY CO. LTD., Fujian (CN)

( * ) Notice: Subject to any disclaimer, the term of this patent is extended or adjusted under 35 U.S.C. 154(b) by 763 days.

(21) Appl. No.: 17/033,965

(22) Filed: Sep. 28, 2020

(65) Prior Publication Data
US 2021/0031170 A1    Feb. 4, 2021

Related U.S. Application Data

(63) Continuation of application No. PCT/CN2019/073981, filed on Jan. 30, 2019.

(30) Foreign Application Priority Data

Apr. 27, 2018 (CN) .......................... 201810394407.5

(51) Int. Cl.
| | |
|---|---|
| B01J 20/32 | (2006.01) |
| B01D 53/02 | (2006.01) |
| B01J 20/04 | (2006.01) |
| B01J 20/06 | (2006.01) |
| B01J 20/10 | (2006.01) |
| B01J 20/28 | (2006.01) |
| B01J 20/30 | (2006.01) |
| C23C 16/40 | (2006.01) |
| C23C 16/56 | (2006.01) |
| F23J 15/02 | (2006.01) |
| B09B 3/40 | (2022.01) |

(52) U.S. Cl.
CPC .......... *B01J 20/3214* (2013.01); *B01D 53/02* (2013.01); *B01J 20/041* (2013.01); *B01J 20/06* (2013.01); *B01J 20/103* (2013.01); *B01J 20/28004* (2013.01); *B01J 20/3021* (2013.01); *B01J 20/3035* (2013.01); *B01J 20/3078* (2013.01); *B09B 3/40* (2022.01); *C23C 16/406* (2013.01); *C23C 16/56* (2013.01); *F23J 15/02* (2013.01); *B01D 2253/106* (2013.01); *B01D 2253/1124* (2013.01); *B01D 2253/25* (2013.01); *B01D 2257/2045* (2013.01); *F23G 2208/00* (2013.01)

(58) Field of Classification Search
CPC ...... B01J 20/32; B01J 20/3214; B01J 20/041; B01J 20/06; B01J 20/103; B01J 20/28004; B01J 20/3021; B01J 20/3035; B01J 20/3078; B09B 3/40; B01D 53/02; B01D 2253/106; B01D 2253/1124; B01D 2253/25; B01D 2257/2045; C23C 16/406; C23C 16/56; F23J 15/02; F23G 2208/00
USPC .......................................................... 502/406
See application file for complete search history.

(56) References Cited

FOREIGN PATENT DOCUMENTS

| | | |
|---|---|---|
| CN | 1623648 | 6/2005 |
| CN | 101773768 | 7/2010 |
| CN | 103041769 | 4/2013 |
| CN | 104930518 | 9/2015 |
| CN | 106268832 | 1/2017 |
| CN | 107930579 | 4/2018 |
| CN | 108525639 | 9/2018 |
| JP | 2000335916 | 12/2000 |
| JP | 2005154722 | 6/2005 |
| JP | 2009523998 | 6/2009 |
| JP | 2015014594 | 1/2015 |
| JP | 2018009785 | 1/2018 |
| WO | 0033947 | 6/2000 |

OTHER PUBLICATIONS

"Office Action of Japan Counterpart Application", dated Nov. 24, 2021, p. 1-p. 4.

*Primary Examiner* — Edward M Johnson
(74) *Attorney, Agent, or Firm* — JCIPRNET

(57) ABSTRACT

The invention discloses a method for preparing a chlorine adsorption material for use in waste incineration and application of the chlorine adsorption material. The chlorine adsorption material adsorptive for chlorine-based substances during the waste incineration is prepared by mixing raw materials which include natural iron ores and quartz stones, and modifying the iron ores and the quartz stones with CaO through an ultrasonic impregnation method. The prepared chlorine adsorption material has a large pore size, a high porosity and a stable structure, and shows higher adsorption efficiency and adsorption capacity for the chlorine-based substances during the waste incineration. The use of the low-cost natural iron ores and quartz stones can reduce the cost in processing the chlorine-based substances, make great use of resources and facilitate environment protection.

13 Claims, No Drawings

METHOD FOR PREPARING CHLORINE ADSORPTION MATERIAL FOR USE IN WASTE INCINERATION AND APPLICATION OF CHLORINE ADSORPTION MATERIAL

CROSS-REFERENCE TO RELATED APPLICATION

This application is a continuation of international PCT application serial no. PCT/CN2019/073981, filed on Jan. 30, 2019, which claims the priority benefit of China application no. 201810394407.5, filed on Apr. 27, 2018. The entirety of each of the above-mentioned patent applications is hereby incorporated by reference herein and made a part of this specification.

BACKGROUND OF THE INVENTION

Technical Field

The invention relates to the field of chlorine adsorption materials, in particular to preparation and application of a chlorine adsorption material for use in waste incineration.

Description of Related Art

The fast-growing economy brings convenience to people, and also produces plenty of solid waste. Due to the complex composition of the solid waste which may have toxicity, combustibility, infectiousness and pathogenicity, etc., the disposal of the solid waste has become a major problem that needs to be solved urgently. Compared with landfills, incineration has advantages such as reduction, controlled sanitation and recovered energy, and is considered as a better waste management method. In general, the solid waste typically contains a chlorine source, which may lead to the production of a large amount of HCl. Therefore, there is a need to control the emission of chlorobenzene during the incineration of plastic waste.

It is general, to remove the HCl through a flue gas cleaning and collecting apparatus during the incineration. According to the physical forms of an adsorbent and reaction products, the flue gas collecting technology for the incineration of the solid waste may be classified into three types, including a wet type, a semi-dry type and a dry type. The wet type technology generally takes an aqueous solution or slurry as a dechlorinating agent, and has good absorption performance but complex process and high cost; the semi-dry type technology makes use of lime slurry with low price, but has a complex pulping system with a pulp transportation route that is prone to failures; and the dry type technology is intended for dechlorination by adding a dry dechlorinating agent, and shows high efficiency in cleaning pollutants and high efficiency in utilizing the adsorbent, with convenience in operation and low product cost. The dechlorinating agent used in dry-type HCl removal mainly depends on the specific surface area of the dechlorinating agent. The larger the specific surface area is, the higher the activity of the dechlorinating agent is, the faster the dechlorination reaction is, and the higher the chlorine capacity is. However, the specific surface area of the active components of the dechlorinating agent is low, therefore, how to increase the specific surface area of the dechlorinating agent while ensuring the strength of the dechlorinating agent is the key to the dechlorinating agent.

Patent CN101773768A discloses a dry dechlorinating agent for removing HCl from gas and a preparation method thereof. With $Na_2CO_3$, $CaCO_3$, CaO, and MgO as active components, cross-linked bentonite as a porosity additive, and methyl cellulose as a foaming agent and an extrusion aid, the dechlorinating agent is prepared by extruding and forming the components above into strips, and then drying and roasting the extruded strips. The adsorbent is simple in preparation process, high in dechlorinating activity, and large in chlorine penetration capacity at low temperature. However, this adsorbent is not suitable for use at very high temperature, and is not recyclable.

Patent CN106268832A discloses a new high-efficiency dechlorinating agent and a preparation method thereof. With one or more of $Na_2CO_3$, $CaCO_3$, CaO, MgO, CuO, ZnO and their derivatives as the active component(s), $NH_4HCO_3$ as a porosity aid, and at least one of $Al_2O_3$, diaspore, kaolin or clay as a carrier and an aid, the dechlorinating agent is prepared by adding partially modified Zn salt and Ca salt as synergistic aids. The components above are added with an appropriate amount of water at a corresponding ratio, blended and mixed, extruded and formed into strips, dried and roasted to prepare the dechlorinating agent. This adsorbent shows high adsorption rate for HCl at high and low concentrations at room temperature, and high dechlorinating accuracy, and has a chlorine capacity up to 35% or above; and meanwhile, this adsorbent can efficiently and deeply remove HCl gas from catalysis, reforming and other sections within a temperature range of 300-600° C., with a chlorine penetration capacity up to 65% or above. However, the pore volume and specific surface area of diaspore, kaolin or clay are limited, and the cost of this adsorbent is high.

The patents above have conducted certain researches on the dechlorinating agents, but generally can only be used under normal or high temperature conditions. They are low in reutilization rate, more in conditional restrictions, and mostly high in the cost of the dechlorinating agents. These problems restrict the application and preparation of the dechlorinating agent.

With respect to the fact and defects in the prior art, the invention is to provide a method for preparing a chlorine adsorption material with low cost, high efficiency and safety and simple production process, and application of the chlorine adsorption material.

BRIEF SUMMARY OF THE INVENTION

According to an aspect of the invention, there is provided a method for preparing a chlorine adsorption material for use in waste incineration is to prepare the chlorine adsorption material adsorptive for chlorine-based substances by mixing natural iron ores and quartz stones, and then adding CaO to a mixed system to modify the natural iron ores and the quartz stones through ultrasonic impregnation.

Further, the chlorine-based substances at least include hydrogen chloride and chlorobenzene.

Further, the method specifically includes the following Steps:
 (1) preparing iron ore powder, to be specific: putting the natural iron ores into a grinder and grinding the natural iron ores, and then sieving the ground natural iron ores to obtain the iron ore powder with a particle size of 0.2-0.3 mm;
 (2) preparing $SiO_2$, to be specific: placing the quartz stones in a tablet press to press the quartz stones into powder, then drying and dehydrating the resulting powder, and then sieving the dried powder through a 60-100-mesh sieve to obtain $SiO_2$ powder;

(3) preparing a $SiO_2$—$Fe_2O_3$ carrier, to be specific: with a chemical vapor deposition method, placing the $SiO_2$ powder prepared in Step (2) in a quartz tube of a chemical vapor deposition device, then weighing the iron ore powder prepared in Step (1) at a ratio of 1:1.7-2.7 of the $SiO_2$ powder to the iron ore powder, and placing the weighed iron ore powder in a sublimator of the chemical vapor deposition device, wherein the quartz tube is vertically arranged opposite to and communicated with the sublimator, and the quartz tube is internally provided with a platform for the placement of the $SiO_2$ powder; introducing air into the quartz tube which is kept at a vacuum degree of 0.08 MPa, so that the $SiO_2$ powder is in a fluidized state; then, heating the quartz tube to 200° C. to remove water in the $SiO_2$ powder and holding for 2-3 h; heating the quartz tube to 400° C. and holding; then, introducing nitrogen into the sublimator and regulating the temperature within the sublimator to 110° C.; after the iron ore powder sublimates completely, regulating the temperature of the sublimator to 400° C., so as to form a reaction chamber by the sublimator and the quartz tube and allow the $SiO_2$ powder in the fluidized state to be fully mixed with the sublimated iron ore powder; holding the reaction chamber at 400° C. for 2 h, to allow iron and an iron compound on the carrier formed from the $SiO_2$ powder and the iron ore powder to be completely oxidized, then cooling the carrier to room temperature, drying the carrier at the room temperature and grinding the carrier into powder; and finally, placing the powder in a tubular furnace, heating to 400° C. at a rate of 3° C. $min^{-1}$ and holding for 1-2 h, thereby obtaining the $SiO_2$—$Fe_2O_3$ carrier;

(4) preparing a solution with $Ca(NO_3)_2 \cdot 4H_2O$ as a precursor at a solid-to-liquid ratio of 0.4-1.2 Kg/L;

(5) adding the solution prepared in Step (4) to a water tank of an ultrasonic cleaner, and then adding the $SiO_2$—$Fe_2O_3$ carrier prepared in Step (3) to the water tank for ultrasonic mixing for 6-9 hours; and (6) calcining the $SiO_2$—$Fe_2O_3$ carrier treated in Step (5) at a temperature of 900° C. to remove $NO_x$ on surface attachments thereof and prepare CaO; modifying the $SiO_2$—$Fe_2O_3$ carrier by CaO; then, cooling the modified $SiO_2$—$Fe_2O_3$ carrier to room temperature; grinding the cooled $SiO_2$—$Fe_2O_3$ carrier to a particle size of 0.1-0.2 mm, thereby obtaining the chlorine adsorption material.

According to one embodiment, the components and parts added in Steps (1), (2) and (4) are as follows:

52 to 67 parts of the natural iron ores;
25 to 30 parts of the quartz stones; and
0.03 to 0.05 parts of $Ca(NO_3)_2 \cdot 4H_2O$.

According to one embodiment, the flow rate of the air introduced into the quartz tube in Step (3) is 80 mL/min.

According to one embodiment, $Ca(NO_3)_2 \cdot 4H_2O$ in Step (4) has a purity of more than 99.9%, and a particle size of less than 5 μm.

According to one embodiment, the ultrasonic cleaner in Step (5) has an operating frequency of 40,000 Hz and an operating power of 100 W.

According to one embodiment, the ultrasonic cleaner in Step (5) maintains the temperature of the water tank at 90° C. during operating.

According to one embodiment, the time for calcining the $SiO_2$—$Fe_2O_3$ carrier treated in Step (5) is 1 h in Step (6).

The resulting chlorine adsorption material is applied to the adsorption of the chlorine-based substances during waste incineration.

DETAILED DESCRIPTION OF THE INVENTION

The invention provides a the chlorine adsorption material is prepared by mixing raw materials which include natural iron ores and quartz stones, and modifying the iron ores and the quartz stones with CaO through ultrasonic impregnation; the resulting chlorine adsorption material has a large pore size, a high porosity and a stable structure, shows higher adsorption efficiency and adsorption capacity for the chlorine-based substances during the waste incineration, and is also reusable; and in addition, the use of the low-cost natural iron ores and quartz stones can reduce the cost in processing the chlorine-based substances, make great use of resources and facilitate environment protection.

A method for preparing a chlorine adsorption material for use in waste incineration specifically includes the following Steps:

(1) preparing iron ore powder, to be specific: putting the natural iron ores into a grinder and grinding the natural iron ores, and then sieving the ground natural iron ores to obtain the iron ore powder with a particle size of 0.2-0.3 mm;

(2) preparing $SiO_2$, to be specific: placing the quartz stones in a tablet press to press the quartz stones into powder, then drying and dehydrating the resulting powder, and then sieving the dried powder through a 60-100-mesh sieve to obtain $SiO_2$ powder;

(3) preparing a $SiO_2$—$Fe_2O_3$ carrier, to be specific: with a chemical vapor deposition method, placing the $SiO_2$ powder prepared in Step (2) in a quartz tube of a chemical vapor deposition device, then weighing the iron ore powder prepared in Step (1) at a ratio of 1:1.7-2.7 of the $SiO_2$ powder to the iron ore powder, and placing the weighed iron ore powder in a sublimator of the chemical vapor deposition device, wherein the quartz tube is vertically arranged opposite to and communicated with the sublimator, and the quartz tube is internally provided with a platform for the placement of the $SiO_2$ powder; introducing air into the quartz tube which is kept at a vacuum degree of 0.08 MPa, so that the $SiO_2$ powder is in a fluidized state; then, heating the quartz tube to 200° C. to remove water in the $SiO_2$ powder and holding for 2-3 h; heating the quartz tube to 400° C. and holding; then, introducing nitrogen into the sublimator and regulating the temperature within the sublimator to 110° C.; after the iron ore powder sublimates completely, regulating the temperature of the sublimator to 400° C., so as to form a reaction chamber by the sublimator and the quartz tube and allow the $SiO_2$ powder in the fluidized state to be fully mixed with the sublimated iron ore powder; holding the reaction chamber at 400° C. for 2 h, to allow iron and an iron compound on the carrier formed from the $SiO_2$ powder and the iron ore powder to be completely oxidized, then cooling the carrier to room temperature, drying the carrier at the room temperature and grinding the carrier into powder; and finally, placing the powder in a tubular furnace, heating to 400° C. at a rate of 3° C. $min^{-1}$ and holding for 1-2 h, thereby obtaining the $SiO_2$—$Fe_2O_3$ carrier;

(4) preparing a solution with $Ca(NO_3)_2 \cdot 4H_2O$ as a precursor at a solid-to-liquid ratio of 0.4-1.2 Kg/L;

(5) adding the solution prepared in Step (4) to a water tank of an ultrasonic cleaner, and then adding the SiO$_2$—Fe$_2$O$_3$ carrier prepared in Step (3) to the water tank for ultrasonic mixing for 6-9 hours; and (6) calcining the SiO$_2$—Fe$_2$O$_3$ carrier treated in Step (5) at a temperature of 900° C. to remove NO$_x$ on surface attachments thereof and prepare CaO; modifying the SiO$_2$—Fe$_2$O$_3$ carrier by CaO; then, cooling the modified SiO$_2$—Fe$_2$O$_3$ carrier to room temperature; grinding the cooled SiO$_2$—Fe$_2$O$_3$ carrier to a particle size of 0.1-0.2 mm, thereby obtaining the chlorine adsorption material.

According to one embodiment, the components and parts added in Steps (1), (2) and (4) are as follows:
52 to 67 parts of the natural iron ores;
25 to 30 parts of the quartz stones; and
0.03 to 0.05 parts of Ca(NO$_3$)$_2$.4H$_2$O.

According to one embodiment, the flow rate of the air introduced into the quartz tube in Step (3) is 80 mL/min.

According to one embodiment, Ca(NO$_3$)$_2$.4H$_2$O in Step (4) has a purity of more than 99.9%, and a particle size of less than 5 μm.

According to one embodiment, the ultrasonic cleaner in Step (5) has an operating frequency of 40,000 Hz and an operating power of 100 W.

According to one embodiment, the ultrasonic cleaner in Step (5) maintains the temperature of the water tank at 90° C. during operating.

According to one embodiment, the time for calcining the SiO$_2$—Fe$_2$O$_3$ carrier treated in Step (5) is 1 h in Step (6).

The resulting chlorine adsorption material is applied to the adsorption of the chlorine-based substances during waste incineration.

Embodiment 1

A method for preparing a chlorine adsorption material for use in waste incineration specifically included the following Steps:

(1) preparation of iron ore powder: natural iron ores were put into a grinder and grinding the natural iron ores, and then sieved to obtain the iron ore powder with a particle size of 0.2-0.3 mm;

(2) preparation of SiO$_2$: the quartz stones were placed in a tablet press and pressed into powder, then dried and dehydrated, and sieved through a 60-100-mesh sieve to obtain SiO$_2$ powder;

(3) preparation of a SiO$_2$—Fe$_2$O$_3$ carrier: with a chemical vapor deposition method, 2 kg of the SiO$_2$ powder prepared in Step (2) were weighed and placed in a quartz tube of a chemical vapor deposition device, 5.36 kg of the iron ore powder prepared in Step (1) were weighed and placed in a sublimator of the chemical vapor deposition device, wherein the quartz tube was vertically arranged opposite to and communicated with the sublimator, and the quartz tube was internally provided with a platform for the placement of the SiO$_2$ powder; the quartz tube was introduced with air at a flow rate of 80 mL/min and is kept at a vacuum degree of 0.08 MPa, so that the SiO$_2$ powder is in a fluidized state; then, the quartz tube was heated to 200° C. to remove water in the SiO$_2$ powder and held for 2 h; the quartz tube was heated to 400° C. and held; then, the sublimator was introduced with nitrogen and was regulated in temperature to 110° C.; after the iron ore powder sublimated completely, the temperature of the sublimator was regulated to 400° C., so as to form a reaction chamber by the sublimator and the quartz tube and allow the SiO$_2$ powder in the fluidized state to be fully mixed with the sublimated iron ore powder; the reaction chamber was head at 400° C. for 2 h, to allow iron and an iron compound on the carrier formed from the SiO$_2$ powder and the iron ore powder to be completely oxidized, and then the carrier was cooled to room temperature and dried at the room temperature; and finally, the carrier was ground into powder and then placed in a tubular furnace, which was heated to 400° C. at a rate of 3° C. min$^{-1}$ and held for 2 h to obtain the SiO$_2$—Fe$_2$O$_3$ carrier;

(4) Ca(NO$_3$)$_2$. 4H$_2$O was taken as a precursor to preparing a solution at a solid-to-liquid ratio of 0.4 Kg/L, the purity was more than 99.9%, and the particle size was less than 5 μm;

(5) the solution prepared in Step (4) was added to a water tank of an ultrasonic cleaner; then the SiO$_2$—Fe$_2$O$_3$ carrier prepared in Step (3) was added to the water tank; and then, the mixed system in the water tank was ultrasonically mixed for 6 h with the operating parameters as follows: the operating frequency of 40000 Hz and the operating power of 100 W, wherein the mixing temperature within the water tank was held at 90° C. during mixing;

(6) the SiO$_2$—Fe$_2$O$_3$ carrier treated in Step (5) was calcined for 1 h at a temperature of 900° C. to remove NO$_x$ on surface attachments thereof and prepare CaO; and the SiO$_2$—Fe$_2$O$_3$ carrier was modified with CaO, then cooled to room temperature, and then ground to a particle size of 0.1-0.2 mm, thereby obtaining the chlorine adsorption material.

Embodiment 2

A method for preparing a chlorine adsorption material for use in waste incineration specifically included the following Steps:

(1) preparation of iron ore powder: natural iron ores were put into a grinder and grinding the natural iron ores, and then sieved to obtain the iron ore powder with a particle size of 0.2-0.3 mm;

(2) preparation of SiO$_2$: the quartz stones were placed in a tablet press and pressed into powder, then dried and dehydrated, and sieved through a 60-100-mesh sieve to obtain SiO$_2$ powder;

(3) preparation of a SiO$_2$—Fe$_2$O$_3$ carrier: with a chemical vapor deposition method, 2 kg of the SiO$_2$ powder prepared in Step (2) were weighed and placed in a quartz tube of a chemical vapor deposition device, 3.46 kg of the iron ore powder prepared in Step (1) were weighed and placed in a sublimator of the chemical vapor deposition device, wherein the quartz tube was vertically arranged opposite to and communicated with the sublimator, and the quartz tube was internally provided with a platform for the placement of the SiO$_2$ powder; the quartz tube was introduced with air at a flow rate of 80 mL/min and is kept at a vacuum degree of 0.08 MPa, so that the SiO$_2$ powder is in a fluidized state; then, the quartz tube was heated to 200° C. to remove water in the SiO$_2$ powder and held for 2 h; the quartz tube was heated to 400° C. and held; then, the sublimator was introduced with nitrogen and was regulated in temperature to 110° C.; after the iron ore powder sublimated completely, the temperature of the sublimator was regulated to 400° C., so as to form a reaction chamber by the sublimator and the quartz tube and allow the SiO$_2$ powder in the fluidized state to be fully mixed with the sublimated iron ore powder; the reaction chamber was head at 400° C. for 2 h, to allow iron and an iron compound on the carrier formed from the SiO$_2$ powder and the iron ore powder to be completely oxidized, and then the carrier was cooled to room temperature and dried at the room temperature; and finally, the carrier was ground into powder and then placed in a tubular furnace, which was heated to 400° C. at a rate of 3° C.min$^{-1}$ and held for 2 h to obtain the SiO$_2$—Fe$_2$O$_3$ carrier;

(4) Ca(NO$_3$)$_2$.4H$_2$O was taken as a precursor to preparing a solution at a solid-to-liquid ratio of 0.4 Kg/L, the purity was more than 99.9%, and the particle size was less than 5 μm;

(5) the solution prepared in Step (4) was added to a water tank of an ultrasonic cleaner; then the SiO$_2$—Fe$_2$O$_3$ carrier prepared in Step (3) was added to the water tank; and then, the mixed system in the water tank was ultrasonically mixed for 8 h with the operating parameters as follows: the operating frequency of 40000 Hz and the operating power of 100 W, wherein the mixing temperature within the water tank was held at 90° C. during mixing;

(6) the SiO$_2$—Fe$_2$O$_3$ carrier treated in Step (5) was calcined for 1 h at a temperature of 900° C. to remove NO$_x$ on surface attachments thereof and prepare CaO; and the SiO$_2$—Fe$_2$O$_3$ carrier was modified with CaO, then cooled to room temperature, and then ground to a particle size of 0.1-0.2 mm, thereby obtaining the chlorine adsorption material.

Embodiment 3

A method for preparing a chlorine adsorption material for use in waste incineration specifically included the following Steps:

(1) preparation of iron ore powder: natural iron ores were put into a grinder and grinding the natural iron ores, and then sieved to obtain the iron ore powder with a particle size of 0.2-0.3 mm;

(2) preparation of SiO$_2$: the quartz stones were placed in a tablet press and pressed into powder, then dried and dehydrated, and sieved through a 60-100-mesh sieve to obtain SiO$_2$ powder;

(3) preparation of a SiO$_2$—Fe$_2$O$_3$ carrier: with a chemical vapor deposition method, 2 kg of the SiO$_2$ powder prepared in Step (2) were weighed and placed in a quartz tube of a chemical vapor deposition device, 5.36 kg of the iron ore powder prepared in Step (1) were weighed and placed in a sublimator of the chemical vapor deposition device, wherein the quartz tube was vertically arranged opposite to and communicated with the sublimator, and the quartz tube was internally provided with a platform for the placement of the SiO$_2$ powder; the quartz tube was introduced with air at a flow rate of 80 mL/min and is kept at a vacuum degree of 0.08 MPa, so that the SiO$_2$ powder is in a fluidized state; then, the quartz tube was heated to 200° C. to remove water in the SiO$_2$ powder and held for 2 h; the quartz tube was heated to 400° C. and held; then, the sublimator was introduced with nitrogen and was regulated in temperature to 110° C.; after the iron ore powder sublimated completely, the temperature of the sublimator was regulated to 400° C., so as to form a reaction chamber by the sublimator and the quartz tube and allow the SiO$_2$ powder in the fluidized state to be fully mixed with the sublimated iron ore powder; the reaction chamber was head at 400° C. for 2 h, to allow iron and an iron compound on the carrier formed from the SiO$_2$ powder and the iron ore powder to be completely oxidized, and then the carrier was cooled to room temperature and dried at the room temperature; and finally, the carrier was ground into powder and then placed in a tubular furnace, which was heated to 400° C. at a rate of 3° C.min$^{-1}$ and held for 2 h to obtain the SiO$_2$—Fe$_2$O$_3$ carrier;

(4) Ca(NO$_3$)$_2$.4H$_2$O was taken as a precursor to preparing a solution at a solid-to-liquid ratio of 0.8 Kg/L, the purity was more than 99.9%, and the particle size was less than 5 μm;

(5) the solution prepared in Step (4) was added to a water tank of an ultrasonic cleaner; then the SiO$_2$—Fe$_2$O$_3$ carrier prepared in Step (3) was added to the water tank; and then, the mixed system in the water tank was ultrasonically mixed for 9 h with the operating parameters as follows: the operating frequency of 40000 Hz and the operating power of 100 W, wherein the mixing temperature within the water tank was held at 90° C. during mixing;

(6) the SiO$_2$—Fe$_2$O$_3$ carrier treated in Step (5) was calcined for 1 h at a temperature of 900° C. to remove NO$_x$ on surface attachments thereof and prepare CaO; and the SiO$_2$—Fe$_2$O$_3$ carrier was modified with CaO, then cooled to room temperature, and then ground to a particle size of 0.1-0.2 mm, thereby obtaining the chlorine adsorption material.

Embodiment 4

A method for preparing a chlorine adsorption material for use in waste incineration specifically included the following Steps:

(1) preparation of iron ore powder: natural iron ores were put into a grinder and grinding the natural iron ores, and then sieved to obtain the iron ore powder with a particle size of 0.2-0.3 mm;

(2) preparation of SiO$_2$: the quartz stones were placed in a tablet press and pressed into powder, then dried and dehydrated, and sieved through a 60-100-mesh sieve to obtain SiO$_2$ powder;

(3) preparation of a SiO$_2$—Fe$_2$O$_3$ carrier: with a chemical vapor deposition method, 2 kg of the SiO$_2$ powder prepared in Step (2) were weighed and placed in a quartz tube of a chemical vapor deposition device, 3.46 kg of the iron ore powder prepared in Step (1) were weighed and placed in a sublimator of the chemical vapor deposition device, wherein the quartz tube was vertically arranged opposite to and communicated with the sublimator, and the quartz tube was internally provided with a platform for the placement of the SiO$_2$ powder; the quartz tube was introduced with air at a flow rate of 80 mL/min and is kept at a vacuum degree of 0.08 MPa, so that the SiO$_2$ powder is in a fluidized state; then, the quartz tube was heated to 200° C. to remove water in the SiO$_2$ powder and held for 2 h; the quartz tube was heated to 400° C. and held; then, the sublimator was introduced with nitrogen and was regulated in temperature to 110° C.; after the iron ore powder sublimated completely, the temperature of the sublimator was regulated to 400° C., so as to form a reaction chamber by the sublimator and the quartz tube and allow the SiO$_2$ powder in the fluidized state to be fully mixed with the sublimated iron ore powder; the reaction chamber was head at 400° C. for 2 h, to allow iron and an iron compound on the carrier formed from the $SiO_2$ powder and the iron ore powder to be completely oxidized, and then the carrier was cooled to room temperature and dried at the room temperature; and finally, the carrier was ground into powder and then placed in a tubular furnace, which was heated to 400° C. at a rate of 3° $C.min^{-1}$ and held for 2 h to obtain the $SiO_2$—$Fe_2O_3$ carrier;

(4) $Ca(NO_3)_2.4H_2O$ was taken as a precursor to preparing a solution at a solid-to-liquid ratio of 1.2 Kg/L, the purity was more than 99.9%, and the particle size was less than 5 μm;

(5) the solution prepared in Step (4) was added to a water tank of an ultrasonic cleaner; then the $SiO_2$—$Fe_2O_3$ carrier prepared in Step (3) was added to the water tank; and then, the mixed system in the water tank was ultrasonically mixed for 9 h with the operating parameters as follows: the operating frequency of 40000 Hz and the operating power of 100 W, wherein the mixing temperature within the water tank was held at 90° C. during mixing;

(6) the $SiO_2$—$Fe_2O_3$ carrier treated in Step (5) was calcined for 1 h at a temperature of 900° C. to remove $NO_x$ on surface attachments thereof and prepare CaO; and the $SiO_2$—$Fe_2O_3$ carrier was modified with CaO, then cooled to room temperature, and then ground to a particle size of 0.1-0.2 mm, thereby obtaining the chlorine adsorption material.

Performance Test

The chlorine adsorption materials prepared in Embodiments 1 to 4 were placed in different waste incineration reactors respectively; then, the reactors were heated to the temperature of 900° C. at the atmosphere of air and held for 30 min to ensure the complete oxidation of the chlorine adsorption material; subsequently, a combustion-supporting syngas (consisting of 1% of HCl, 21.9% of CO, 5.9% of $CH_4$, 12.7% of $H_2$, 7.8% of $CO_2$ and 50.7% of $N_2$) was introduced and pushed into an incinerator through an air nozzle for combusting with the waste; after the complete combustion, the content of HCl in the flue gas was measured. In addition, a test where the chlorine adsorption material was not added was newly added so as to measure the content of HCl in the flue gas when the chlorine adsorption material was not added. The results obtained were as follows:

| Item | Content of chlorine substances without adsorption material added (ppm) | Content of chlorine substances with adsorption material added (ppm) |
|---|---|---|
| Embodiment 1 | 367.2 | 55.7 |
| Embodiment 2 | 367.2 | 60.6 |
| Embodiment 3 | 367.2 | 45.4 |
| Embodiment 4 | 367.2 | 39.9 |

According to the requirements of Standard for Pollution Control on the Municipal Solid Waste Incineration (GB 18485-2014), the limit for HCl is 60 ppm (a mean value in 1 hour) or 50 ppm (a mean value in 24 hours). It can be seen from this that the addition of the chlorine adsorption material prepared according to the solutions of the invention can enable the adsorption of the chlorine-based substances generated during waste incineration, and the indexes required by relevant regulations in China are met.

The above description provides the embodiments of the invention. For those skilled in the art, any equivalent alternations, modifications, substitutions and variations made depending on the patent scope of the invention application according to the teaching of the invention without departing from the principle and spirit of the invention shall fall within the scope covered by the invention.

What is claimed is:

1. A method for preparing a chlorine adsorption material for use in waste incineration, wherein the chlorine adsorption material adsorptive for chlorine-based substances is prepared by mixing natural iron ores and quartz stones, and then adding CaO to a mixed system to modify the natural iron ores and the quartz stones through ultrasonic impregnation; and the method specifically comprises the following Steps:

(1) preparing iron ore powder, to be specific: putting the natural iron ores into a grinder and grinding the natural iron ores, and then sieving the ground natural iron ores to obtain the iron ore powder with a particle size of 0.2-0.3 mm;

(2) preparing $SiO_2$, to be specific: placing the quartz stones in a tablet press to press the quartz stones into powder, then drying and dehydrating the resulting powder, and then sieving the dried powder through a 60-100-mesh sieve to obtain $SiO_2$ powder;

(3) preparing a $SiO_2$—$Fe_2O_3$ carrier, to be specific: with a chemical vapor deposition method, placing the $SiO_2$ powder prepared in Step (2) in a quartz tube of a chemical vapor deposition device, then weighing the iron ore powder prepared in Step (1) at a ratio of 1:1.7-2.7 of the $SiO_2$ powder to the iron ore powder, and placing the weighed iron ore powder in a sublimator of the chemical vapor deposition device, wherein the quartz tube is vertically arranged opposite to and communicated with the sublimator, and the quartz tube is internally provided with a platform for the placement of the $SiO_2$ powder; introducing air into the quartz tube which is kept at a vacuum degree of 0.08 MPa, so that the $SiO_2$ powder is in a fluidized state; then, heating the quartz tube to 200° C. to remove water in the $SiO_2$ powder and holding for 2-3 h; heating the quartz tube to 400° C. and holding; then, introducing nitrogen into the sublimator and regulating the temperature within the sublimator to 110° C.; after the iron ore powder sublimates completely, regulating the temperature of the sublimator to 400° C., so as to form a reaction chamber by the sublimator and the quartz tube and allow the $SiO_2$ powder in the fluidized state to be fully mixed with the sublimated iron ore powder; holding the reaction chamber at 400° C. for 2 h, to allow iron and an iron compound on the carrier formed from the $SiO_2$ powder and the iron ore powder to be completely oxidized, then cooling the carrier to room temperature, drying the carrier at the room temperature and grinding the carrier into powder; and finally, placing the powder in a tubular furnace, heating to 400° C. at a rate of 3° $C.min^{-1}$ and holding for 1-2h, thereby obtaining the $SiO_2$—$Fe_2O_3$ carrier;

(4) preparing a solution with $Ca(NO_3)_2.4H_2O$ as a precursor at a solid-to-liquid ratio of 0.4-1.2 Kg/L;

(5) adding the solution prepared in Step (4) to a water tank of an ultrasonic cleaner, and then adding the $SiO_2$—$Fe_2O_3$ carrier prepared in Step (3) to the water tank for ultrasonic mixing for 6-9 hours; and (6) calcining the $SiO_2$—$Fe_2O_3$ carrier treated in Step (5) at a temperature of 900° C. to remove $NO_x$ on surface attachments thereof and prepare CaO; modifying the $SiO_2$—$Fe_2O_3$ carrier by CaO; then, cooling the modified $SiO_2$—$Fe_2O_3$ carrier to room temperature; grinding the cooled $SiO_2$—$Fe_2O_3$ carrier to a particle size of 0.1-0.2 mm, thereby obtaining the chlorine adsorption material.

2. The method for preparing the chlorine adsorption material for use in the waste incineration according to claim 1, wherein the chlorine-based substances at least comprise hydrogen chloride and chlorobenzene.

3. The method for preparing the chlorine adsorption material for use in the waste incineration according to claim 1, wherein the components and parts thereof added in Steps (1), (2) and (4) are as follows:
  52 to 67 parts of the natural iron ores;
  25 to 30 parts of the quartz stones; and
  0.03 to 0.05 parts of $Ca(NO_3)_2 \cdot 4H_2O$.

4. The method for preparing the chlorine adsorption material for use in the waste incineration according to claim 1, wherein the flow rate of the air introduced into the quartz tube in Step (3) is 80 mL/min.

5. The method for preparing the chlorine adsorption material for use in the waste incineration according to claim 1, wherein $Ca(NO_3)_2 \cdot 4H_2O$ in Step (4) has a purity of more than 99.9%, and a particle size of less than 5 μm.

6. The method for preparing the chlorine adsorption material for use in the waste incineration according to claim 1, wherein the ultrasonic cleaner in Step (5) maintains the temperature of the water tank at 90° C. during operating.

7. The method for preparing the chlorine adsorption material for use in the waste incineration according to claim 1, wherein the ultrasonic cleaner in Step (5) has an operating frequency of 40,000 Hz and an operating power of 100 W.

8. An application of the chlorine adsorption material prepared by the method for preparing the chlorine adsorption material for use in the waste incineration according to claim 1, wherein the prepared chlorine adsorption material is applied to adsorption of the chlorine-based substances during the waste incineration.

9. An application of the chlorine adsorption material prepared by the method for preparing the chlorine adsorption material for use in the waste incineration according to claim 2, wherein the prepared chlorine adsorption material is applied to adsorption of the chlorine-based substances during the waste incineration.

10. An application of the chlorine adsorption material prepared by the method for preparing the chlorine adsorption material for use in the waste incineration according to claim 3, wherein the prepared chlorine adsorption material is applied to adsorption of the chlorine-based substances during the waste incineration.

11. An application of the chlorine adsorption material prepared by the method for preparing the chlorine adsorption material for use in the waste incineration according to claim 4, wherein the prepared chlorine adsorption material is applied to adsorption of the chlorine-based substances during the waste incineration.

12. An application of the chlorine adsorption material prepared by the method for preparing the chlorine adsorption material for use in the waste incineration according to claim 5, wherein the prepared chlorine adsorption material is applied to adsorption of the chlorine-based substances during the waste incineration.

13. An application of the chlorine adsorption material prepared by the method for preparing the chlorine adsorption material for use in the waste incineration according to claim 6, wherein the prepared chlorine adsorption material is applied to adsorption of the chlorine-based substances during the waste incineration.

* * * * *